US012588315B2

(12) United States Patent
Sun et al.

(10) Patent No.: US 12,588,315 B2
(45) Date of Patent: Mar. 24, 2026

(54) III-NITRIDE SEMICONUCTOR DEVICES HAVING A BORON NITRIDE ALLOY CONTACT LAYER AND METHOD OF PRODUCTION

(71) Applicant: KING ABDULLAH UNIVERSITY OF SCIENCE AND TECHNOLOGY, Thuwal (SA)

(72) Inventors: Haiding Sun, Thuwal (SA); Xiaohang Li, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 276 days.

(21) Appl. No.: 16/652,214

(22) PCT Filed: Oct. 15, 2018

(86) PCT No.: PCT/IB2018/057982
§ 371 (c)(1),
(2) Date: Mar. 30, 2020

(87) PCT Pub. No.: WO2019/077474
PCT Pub. Date: Apr. 25, 2019

(65) Prior Publication Data
US 2020/0274024 A1 Aug. 27, 2020

Related U.S. Application Data

(60) Provisional application No. 62/572,672, filed on Oct. 16, 2017.

(51) Int. Cl.
*H01L 33/00* (2010.01)
*H01L 21/02* (2006.01)
(Continued)

(52) U.S. Cl.
CPC ..... *H10H 20/0137* (2025.01); *H01L 21/0254* (2013.01); *H01L 21/283* (2013.01);
(Continued)

(58) Field of Classification Search
CPC .............. H01L 21/0254; H01L 21/283; H01L 29/2003; H01L 29/205; H01L 2933/0016;
(Continued)

(56) References Cited

U.S. PATENT DOCUMENTS 7,635,872 B2 * 12/2009 Asano ................... H01L 33/007
438/22
8,106,403 B2 * 1/2012 McLaurin ............... H01S 5/343
257/E33.028
(Continued)

FOREIGN PATENT DOCUMENTS

CN       102637801 A       8/2012
CN       104916751 A       9/2015
(Continued)

OTHER PUBLICATIONS

Guo et al., "Study of Schottky barriers on n-type GaN grown by low-pressure metalorganic chemical vapor deposition," Applied Physics Letters 67 (1995) pp. 2657-2659.*
(Continued)

*Primary Examiner* — Jay C Kim
(74) *Attorney, Agent, or Firm* — PATENT PORTFOLIO BUILDERS PLLC

(57) ABSTRACT
A method for forming a III-nitride semiconductor device involves determining work functions of a first III-nitride contact layer and a first metal contact. The determined work function of the first III-nitride contact layer is based on a group III element of the first III-nitride contact layer. Based on the determined work functions of the first III-nitride contact layer and of the first metal contact, it is determined
(Continued)

that the work function of the first III-nitride contact layer should be adjusted. The III-nitride semiconductor device is formed including the first III-nitride contact layer adjacent to a second III-nitride contact layer, the first metal contact arranged on the first III-nitride contact layer, and a second metal contact arranged on the second III-nitride contact layer. The first III-nitride contact layer of the formed III-nitride semiconductor device is a boron nitride alloy having an amount of boron that adjusts the work function of the first III-nitride contact layer relative to the determined work function of the first metal layer based on the group III element of the first III-nitride contact layer.

10 Claims, 4 Drawing Sheets

(51) Int. Cl.

| | |
|---|---|
| *H01L 21/283* | (2006.01) |
| *H10D 62/824* | (2025.01) |
| *H10D 62/85* | (2025.01) |
| *H10H 20/01* | (2025.01) |
| *H10H 20/811* | (2025.01) |
| *H10H 20/816* | (2025.01) |
| *H10H 20/824* | (2025.01) |
| *H10H 20/832* | (2025.01) |

(52) U.S. Cl.
CPC ....... *H10D 62/824* (2025.01); *H10D 62/8503* (2025.01); *H10H 20/811* (2025.01); *H10H 20/8162* (2025.01); *H10H 20/824* (2025.01); *H10H 20/832* (2025.01); *H10H 20/032* (2025.01)

(58) Field of Classification Search
CPC ............. H01L 33/0075; H01L 29/0025; H01L 33/145; H01L 33/40; H10H 20/0137; H10H 20/811; H10H 20/8162; H10H 20/824; H10H 20/832; H10H 20/032; H10H 20/81; H10H 20/825; H10D 62/824; H10D 62/8503; H10D 30/6737; H10D 30/675
See application file for complete search history.

(56) References Cited

U.S. PATENT DOCUMENTS

| | | | | |
|---|---|---|---|---|
| 9,379,523 | B2 | 6/2016 | Enya et al. | |
| 9,608,185 | B2 * | 3/2017 | Hu ...................... | H01L 33/0075 |
| 10,554,020 | B2 * | 2/2020 | Tang ...................... | H01L 33/10 |
| 2007/0228408 | A1 | 10/2007 | Asano | |

FOREIGN PATENT DOCUMENTS

| | | | |
|---|---|---|---|
| EP | 0458353 | A2 | 11/1991 |
| JP | H0429375 | A | 1/1992 |
| JP | 2000252230 | A | 9/2000 |
| JP | 2000332295 | A | 11/2000 |
| JP | 2000332362 | A | 11/2000 |
| JP | 2001351506 | A | 12/2001 |
| JP | 2007294877 | A | 11/2007 |
| JP | 2015513798 | A | 5/2015 |
| TW | 200423439 | A | 11/2004 |
| WO | 2008057193 | A1 | 5/2008 |

OTHER PUBLICATIONS

Yaganeh et al., "Barrier height and ideality factor dependency on identically produced small Au/p-Si Schottky barrier diodes," Journal of Semiconductors 31 (2010) 074001.*
Hudait et al., "Doping dependence of the barrier height and ideality factor of Au/n-GaAs Schottky diodes at low temperatures," Physica B 307 (2001) pp. 125-137.*
Eglash et al., "Engineered Schottky barrier diodes for the modification and control of Schottky barrier heights," Journal of Applied Physics 61 (1987) pp. 5159-5169.*
Yang et al., "Fast identification of the conduction-type of nanomaterials by field emission technique," Scientific Reports 7 (2017) 13057.*
Zhong et al., "Charge transport mechanisms of graphene/semiconductor Schottky barriers: A theoretical and experimental study," Journal of Applied Physics 115 (2014) 013701.*
Japanese Office Action for corresponding/related Japanese Patent Application No. 2020-542216 dated Aug. 30, 2021.
Sun et al., "Band Alignment of B0.14Al0.86N/Al0.7Ga0.3N Heterojunction," Applied Physics Letters, Sep. 21, 2017, vol. 111, pp. 122106-1-122106-5, AIP Publishing.
Wikipedia, "Work Function", lasted edited on Feb. 29, 2020, downloaded on Mar. 30, 2020, 6 pages (https//en.wikipedia.or/wiki/Work_function).
Japanese Second Office Action for corresponding/related Japanese Patent Application No. 2020-542216 dated Mar. 14, 2022.
International Search Report in corresponding/related International Application No. PCT/IB2018/057982, date of mailing Dec. 21, 2018.
Written Opinion of the International Searching Authority in corresponding/related International Application No. PCT/IB2018/057982, date of mailing Dec. 21, 2018.
First Office Action in corresponding/related Chinese Application No. 201880067455.1, issued Jan. 19, 2023.
Search Report in corresponding/related Chinese Application No. 201880067455.1, issued Jan. 9, 2023.

* cited by examiner

FIG. 1A
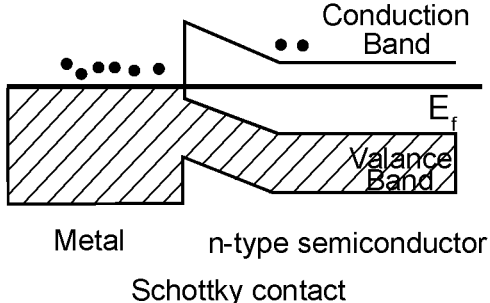
Conduction
Band
$E_f$
Valance
Band
Metal          n-type semiconductor
Schottky contact
FIG. 1B
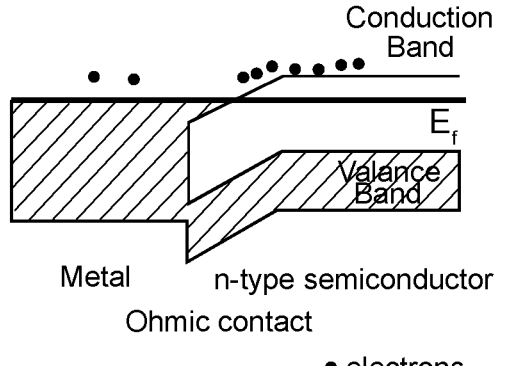
Conduction
Band
$E_f$
Valance
Band
Metal          n-type semiconductor
Ohmic contact
● electrons
FIG. 1C
Conduction
Band
$E_f$
Valance
Band
Metal          p-type semiconductor
Schottky contact
FIG. 1D
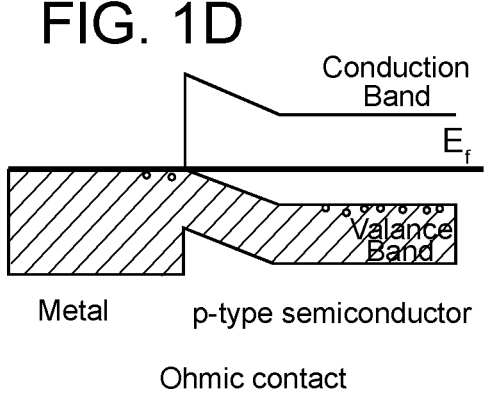
Conduction
Band
$E_f$
Valance
Band
Metal          p-type semiconductor
Ohmic contact
○ holes

205

Determine Work Functions of First III-Nitride Contact Layer and First Metal Contact

210

Determine that Work Function of First III-Nitride Contact Layer Should be Adjusted

215

Form III-Nitride Semiconductor Device With the First III-Nitride Contact Layer Having an Amount of Boron that Adjusts the Work Function of the Layer

FIG. 4

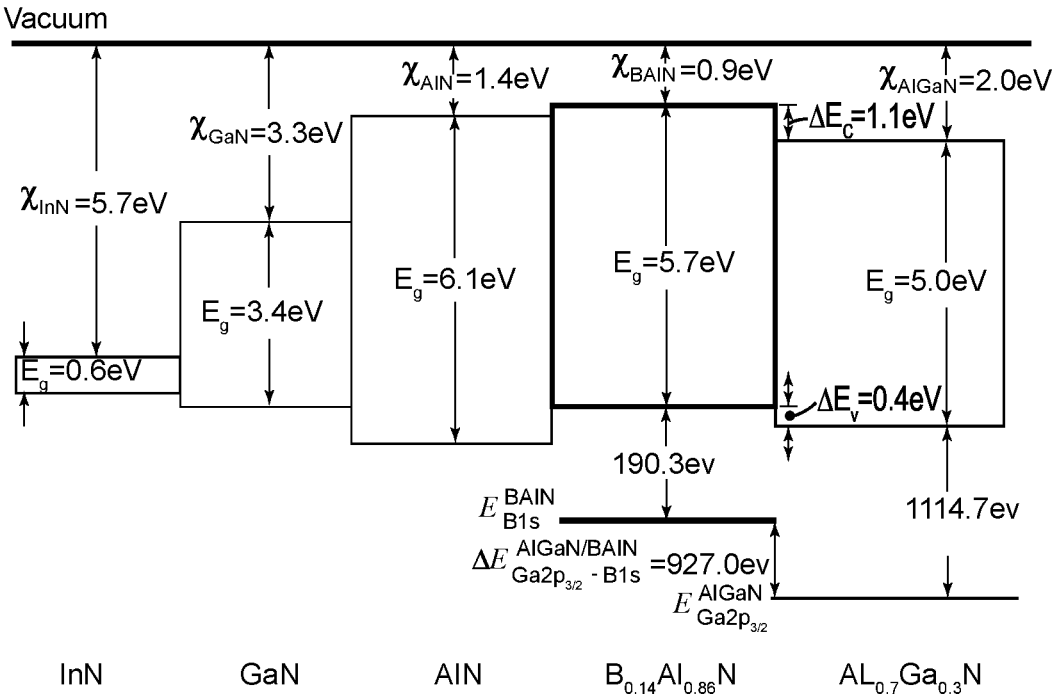

Vacuum $\chi_{InN} = 5.7eV$    $\chi_{GaN} = 3.3eV$    $\chi_{AlN} = 1.4eV$    $\chi_{BAlN} = 0.9eV$    $\chi_{AlGaN} = 2.0eV$ $\Delta E_c = 1.1eV$ $E_g = 0.6eV$    $E_g = 3.4eV$    $E_g = 6.1eV$    $E_g = 5.7eV$    $E_g = 5.0eV$ $\Delta E_v = 0.4eV$ 190.3ev $E_{B1s}^{BAlN}$ $\Delta E_{Ga2p_{3/2} - B1s}^{AlGaN/BAlN} = 927.0ev$ 1114.7ev $E_{Ga2p_{3/2}}^{AlGaN}$ InN     GaN     AlN     $B_{0.14}Al_{0.86}N$     $AL_{0.7}Ga_{0.3}N$

FIG. 5

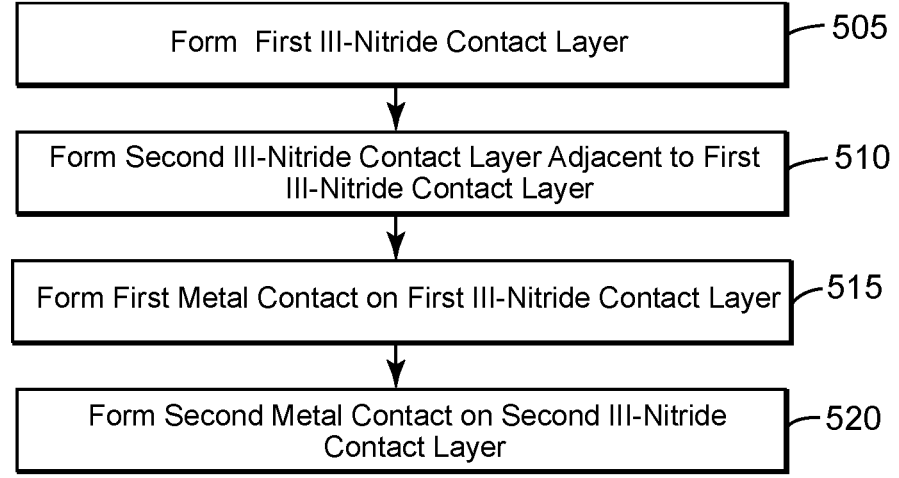

| | |
|---|---|
| Form First III-Nitride Contact Layer | 505 |
| Form Second III-Nitride Contact Layer Adjacent to First III-Nitride Contact Layer | 510 |
| Form First Metal Contact on First III-Nitride Contact Layer | 515 |
| Form Second Metal Contact on Second III-Nitride Contact Layer | 520 |

III-NITRIDE SEMICONUCTOR DEVICES HAVING A BORON NITRIDE ALLOY CONTACT LAYER AND METHOD OF PRODUCTION

This application is a U.S. National Stage Application of International Application No. PCT/IB2018/057982, filed on Oct. 15, 2018, which claims priority to U.S. Provisional Patent Application No. 62/572,672, filed on Oct. 16, 2017, entitled "BORON CONTAINING III-NITRIDE METAL CONTACT LAYERS," the disclosure of which is incorporated herein by reference in its entirety.

BACKGROUND

Technical Field

Embodiments of the disclosed subject matter generally relate to III-nitride semiconductor devices with at least one contact layer having a boron nitride alloy to adjust the work function of the contact layer relative to the work function of the contact layer without boron.

Discussion of the Background

III-nitride semiconductors (aluminum nitride (AlN), gallium nitride (GaN), indium nitride (InN), boron nitride (BN) and their alloys) have emerged as key materials for fabricating optoelectronic devices, such as light emitting diodes (LEDs), laser diodes, photodetectors, and also for high-power electronics such as high electron mobility transistors (HEMTs). The formation of low-resistance ohmic contacts is essential for the further improvement of the electrical and optical performance of III-nitride devices because large contact resistance can lead to large voltage drop across the contact interface, resulting in poor power efficiency and decreased device reliability due to heating issues.

Whether a metal contact on a doped semiconductor layer forms a Schottky contact with different contact barriers or an ohmic contact largely depends on the work functions ($\Phi$) of the metal contact and doped semiconductor layer. The work function represents the distance between the Fermi level ($E_f$) relative to the vacuum level, which is affected by the positions of conduction band edge and valence band edge, as well as doping.

As illustrated in FIG. 1A, when the work function of a metal contact is larger than the work function of an n-type semiconductor contact layer, a Schottky contact is formed, which hinders the flow of electrons from the metal contact to the n-type semiconductor contact layer. As the work function of an n-type semiconductor contact layer increases due to lower conduction band edge or Fermi level, the Schottky barrier or contact barrier decreases, which increases the flow of electrons of the metal contact to the n-type semiconductor contact layer. When the work function of an n-type semiconductor contact layer is equal or larger than the work function of a metal contact, as illustrated in FIG. 1B, an ohmic contact is formed, which allows the flow of electrons from the metal contact to the n-type semiconductor contact layer.

A p-type semiconductor contact layer has the opposite behavior than an n-type semiconductor contact layer. Specifically, as illustrated in FIG. 10, when the work function of the metal contact is smaller than the work function of the p-type semiconductor contact layer, a Schottky contact is formed, which hinders the flow of holes from the metal contact into the p-type semiconductor contact layer. As the work function of an p-type semiconductor contact layer decreases due to higher valence band edge or Fermi level, the Schottky barrier, or contact barrier decreases which increases the flow of holes from the metal contact to the n-type semiconductor contact layer. Further, as illustrated in FIG. 1D, when the work function of the metal contact is equal to or larger than the work function of the p-type semiconductor contact layer, an ohmic contact is formed, which allows the flow of holes from the metal contact into the p-type semiconductor contact layer.

Thus, it would be desirable to provide for n- and p-type semiconductor contact layers that have a reduced contact barrier with the metal contact arranged on the contact layers.

SUMMARY

According to an embodiment, there is a method for forming a III-nitride semiconductor device. The method involves determining work functions of a first III-nitride contact layer and a first metal contact, wherein the determined work function of the first III-nitride contact layer is based on a group III element of the first III-nitride contact layer; determining, based on the determined work functions of the first III-nitride contact layer and of the first metal contact, that the work function of the first III-nitride contact layer should be adjusted; and forming the III-nitride semiconductor device comprising the first III-nitride contact layer adjacent to a second III-nitride contact layer, the first metal contact arranged on the first III-nitride contact layer, and a second metal contact arranged on the second III-nitride contact layer, wherein the first III-nitride contact layer of the formed III-nitride semiconductor device is a boron nitride alloy having an amount of boron that adjusts the work function of the first III-nitride contact layer relative to the determined work function of the first metal layer based on the group III element of the first III-nitride contact layer.

According to another embodiment, there is a semiconductor device, which includes a first III-nitride contact layer; a first metal contact arranged on the first III-nitride contact layer; a second III-nitride contact layer arranged adjacent to the first III-nitride contact layer; and a second metal contact arranged on the second III-nitride contact layer, wherein the first III-nitride contact layer comprises a boron nitride alloy having an additional group III element, wherein the first III-nitride contact layer comprises an amount of boron that adjusts a work function of the first boron nitride alloy contact layer compared to a contact layer comprising the additional group III element and nitride.

According to a further embodiment, there is a method for forming a III-nitride semiconductor device. The method involves forming a first III-nitride contact layer; forming a second III-nitride contact layer adjacent to the first III-nitride contact layer; forming a first metal contact on the first III-nitride contact layer; and forming a second metal contact on the second III-nitride contact layer, wherein the first and second III-nitride contact layers are different boron nitride alloys.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 1A and 1B are diagrams of Schottky and ohmic contacts, respectively, for a metal to n-type semiconductor junction;

FIGS. 1C and 1D are diagrams of Schottky and ohmic contacts, respectively, for a metal to p-type semiconductor junction;

FIG. 4 is graph of the valence and conduction band offsets between III-nitride materials according to embodiments; and FIG. 5 is a flowchart of a method of forming a III-nitride semiconductor device according to embodiments.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of III-nitride semiconductor devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figures 2, 3A:
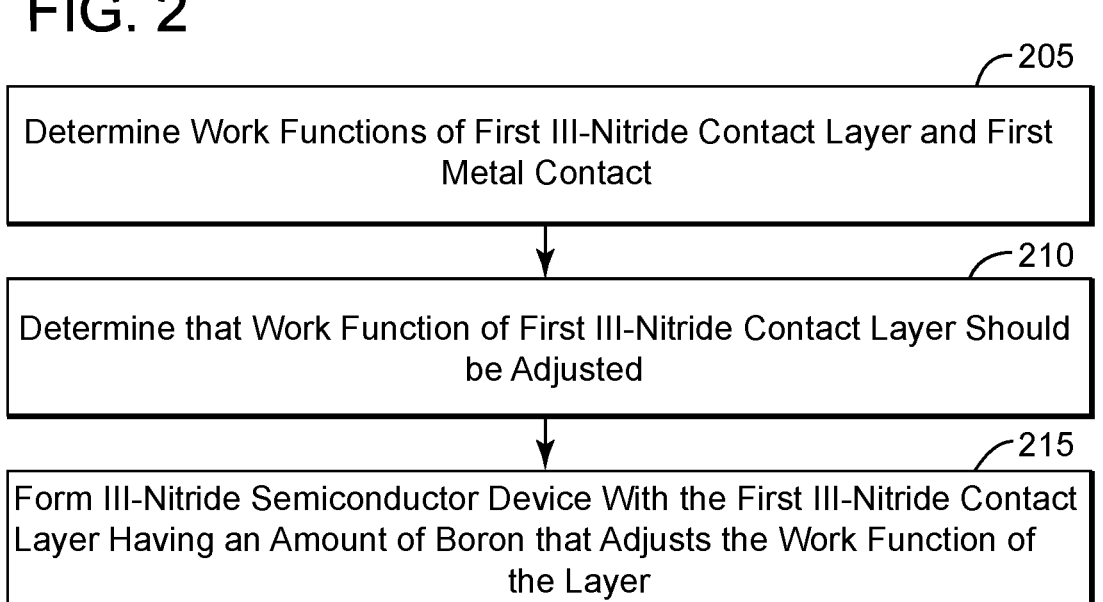
FIG. 2 is a flowchart of a method of forming a III-nitride semiconductor device according to embodiments.
FIGS. 3A-3C are block diagrams of III-nitride semiconductor devices according to embodiments.

FIG. 2 is a flowchart of a method of forming a III-nitride semiconductor device according to embodiments. Initially, work functions of a first III-nitride contact layer and a first metal contact are determined (step 205). The determined work function of the first III-nitride contact layer is based on a group III element of the first III-nitride contact layer. Next, based on the determined work functions of the first III-nitride contact layer and of the first metal contact, it is determined that the work function of the first III-nitride contact layer should be adjusted (step 210). The III-nitride semiconductor device is formed comprising the first III-nitride contact layer adjacent to a second III-nitride contact layer, the first metal contact arranged on the first III-nitride contact layer, and a second metal contact arranged on the second III-nitride contact layer (step 215). The first III-nitride contact layer of the formed III-nitride semiconductor device is a boron nitride alloy having an amount of boron that adjusts the work function of the first III-nitride contact layer relative to the determined work function of the first metal layer based on the group III element of the first III-nitride contact layer. The group III element of the first III-nitride contact layer can be one or more of gallium, indium, or aluminum.

The amount of boron used to adjust the work function of the first III-nitride contact layer can be determined by first growing different layers with various boron compositions. Then experimental measurements can be performed of the conduction band minima, valence band maxima, and work functions of the layers. The work functions can then be compared with the work function of the metal used for the metal contact. Depending on whether the contact layers are p-type or n-type, the different boron compositions corresponding to the different work functions would be determined. This can be performed once and the information from the experimental measurements can then be used for adjusting the work function of different contact layers in the same or different devices. Alternatively, the boron composition of the contact layer can be determined by theoretical calculation.

It should be appreciated that a boron nitride alloy contact layer includes at least 0.1% boron, which indicates an intentional inclusion of boron and not that the boron is part of the contact layer as an impurity or contaminant arising during the formation of the device. Further, the group III element (or more than one group III element) includes at least 0.1% of the group III element (or of each of the more than one group III element), which indicates an intentional inclusion of the group III element (or more than one group III element) and not that the group III element (or more than one group III element) is part of the contact layer as an impurity or contaminant arising during formation of the device.

As discussed below, there may be one or more semiconductor layers arranged between the first and second III-nitride contact layers. Accordingly, the phrase formed adjacent to should be understood as covering both a direct physical connection between the first and second III-nitride contact layers, as well as covering one or more semiconductor layers being interposed between the first and second III-nitride contact layers. Thus, the method of FIG. 2 can also involve forming a semiconductor layer between the first and second III-nitride contact layers, forming a heterojunction of two semiconductor layers between the first and second III-nitride contact layers, forming a homojunction of two semiconductor layers between the first and second III-nitride contact layers, or forming a three or more semiconductor layers between the first and second III-nitride contact layers.

Including boron in a III-nitride alloy layer having another group III element adjusts the work function compared to a layer comprising the another group III element and nitride, i.e., without boron. Thus, for example, a layer comprising the another group III element and nitride having a metal contact on it may form a Schottky contact, whereas the addition of boron to the layer so that the layer is a boron nitride alloy contact layer can form an ohmic contact with the metal contact. It should be recognized that the addition of boron need not change the contact between the contact layer and the metal contact from a Schottky contact to an ohmic contact, the additional boron can reduce the contact barrier between the boron nitride alloy layer and the metal contact, while still forming a Schottky contact. The reduced contact barrier will improve the overall performance of the semiconductor device. Specifically, the work function of metal contacts relative to the work function of a III-nitride contact layer that does not include boron typically results in a large contact resistance, leading to a large voltage drop across the interface between the metal contact and the III-nitride contact layer, which results in a semiconductor device having poor power efficiency and decreased reliability (due to additional heat generated from the large contact resistance). Thus, even when a Schottky contact is formed between the contact layer and the metal contact, the overall device performance can be improved by adding boron to the contact layer because the voltage drop across the interface between the metal contact and the III-nitride contact layer will be reduced by the addition of the boron.

Accordingly, when the first and/or second doped III-nitride contact layer is an n-type doped contact layer, an amount of the boron in the first and/or second III-nitride contact layer is selected so that the first and/or second III-nitride contact layer has a larger work function than a contact layer without boron, respectively. Similarly, when the first and/or second III-nitride contact layer is a p-type doped contact layer, an amount of the boron in the first and/or second III-nitride alloy contact layer is selected so that the first and/or second III-nitride contact layer has a smaller work function than a contact layer without boron, respectively.

Although the method of FIG. 2 is described as the first III-nitride contact layer having an amount of boron that adjusts the work function of the layer, the method can also involve the second III-nitride contact layer having an amount of boron that adjusts the work function of the layer. In this case, the method of FIG. 2 can also involve determining a work function of the second III-nitride contact layer and a work function of the second metal contact and determining, based on the determined work functions of the second III-nitride contact layer and of the second metal contact, that the work function of the second III-nitride contact layer should be adjusted. The second III-nitride contact layer of the formed III-nitride semiconductor device is a boron nitride alloy having an amount of boron that adjusts the work function of the second III-nitride contact layer relative to the determined work function of the second metal layer based on the group III element of the second III-nitride contact layer.

The composition of the first and second III-nitride contact layers varies depending upon the particular semiconductor device being formed. For example, the first and/or second III-nitride contact layers can comprise any type of boron nitride alloy, including: boron aluminum nitride, boron gallium nitride; boron indium nitride; boron aluminum gallium nitride, boron indium gallium nitride, boron aluminum indium nitride, and boron aluminum gallium indium nitride. In one particular example, the first and/or second III-nitride contact layer can comprise $B_{0.14}Al_{0.86}N$.

Figure 3B:
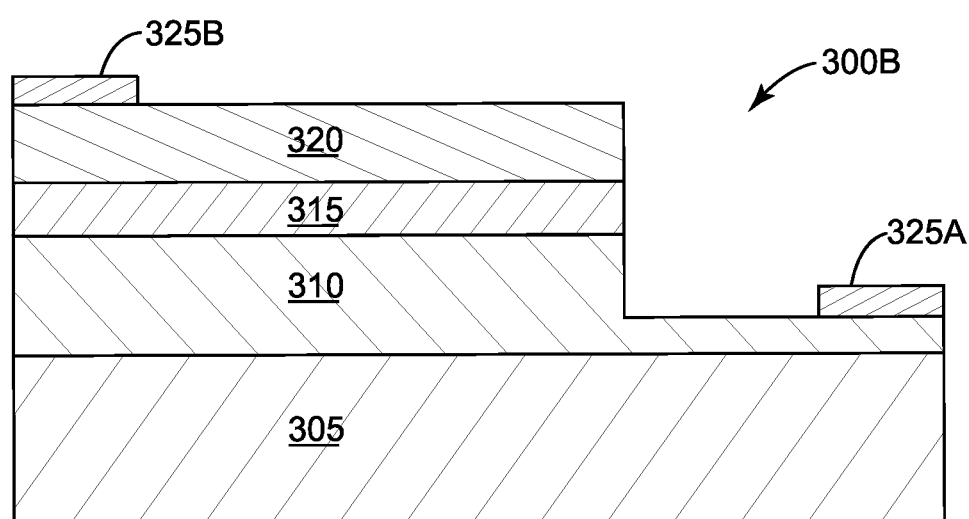
Figure 3C:
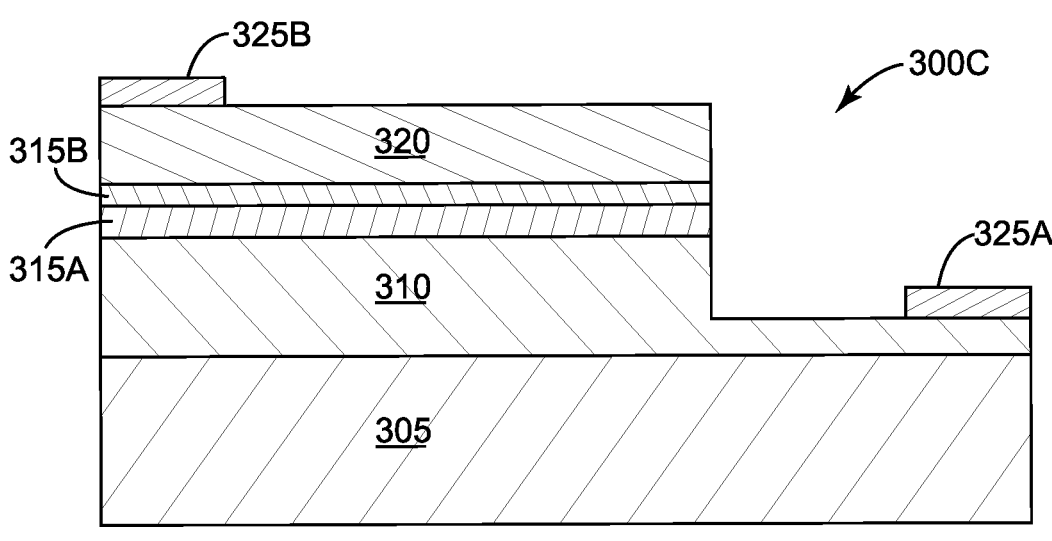

FIGS. 3A-3C are block diagrams of III-nitride semiconductor devices having a lateral mesa-type design according to embodiments. The semiconductor device 300A illustrated in FIG. 3A includes a first III-nitride contact layer 310 arranged on a substrate 305 and a second III-nitride contact layer 320 arranged on the first III-nitride contact layer 310. A first metal contact 325A is arranged on the first III-nitride contact layer 310 and a second metal contact is arranged on the second III-nitride contact layer 320. One of the first 305 and second 310 III-nitride contact layers comprises a boron nitride alloy and includes an additional group III element. One of the first and second III-nitride contact layer comprises an amount of boron that adjusts a work function of the first boron nitride alloy contact layer compared to a contact layer comprising the additional group III element and nitride. The semiconductor device 300A is a p-n diode in which one of the first and second III-nitride contact layers is p-type doped and the other is n-type doped. Thus, the first and second III-nitride contact layers can comprise at least one different group III element.

FIGS. 3B and 3C illustrate semiconductor devices 300B and 300C with one or more semiconductor layers interposed between the first and second III-nitride contact layers 310 and 320. Specifically, in FIG. 3B, a semiconductor layer 315 is interposed between the first 310 and second 320 III-nitride contact layers. Thus, in this example, the semiconductor layer 315 is arranged on the first III-nitride contact layer 310 and the second III-nitride contact layer is arranged on the semiconductor layer 315. In FIG. 3C, a heterojunction of a first 315A and second 315B semiconductor layers can be interposed between the first 310 and second 320 contact layers. Thus, in this example, the first semiconductor layer 315A is arranged on the first III-nitride contact layer 310 and the second III-nitride contact layer 320 is arranged on the second semiconductor layer 320. Depending upon the compositions of the semiconductor layer 315 (or layers 315A and 315B) and of the first 310 and second 315 contact layers, the semiconductor devices 300B and 300C can be optoelectronic devices (e.g., a light emitting diode, laser, photodetector, etc.) or high electron mobility transistors (HEMTs). Those skilled in the art will understand how to form an optoelectronic device or high electron mobility transistor by selecting the compositions of the semiconductor layer 315 (or layers 315A and 315B) and of the first 310 and second 315 contact layers.

FIGS. 3A-3C have been described as involving first and second III-nitride contact layers and first and second metal contact. The first and second III-nitride contact layers and first and second metal contacts need not directly correspond to the first and second III-nitride contact layers and first and second metal contacts discussed above in connection with the method illustrated in FIG. 2. Thus, for example, the first III-nitride contact layer and first metal contact of the method illustrated in FIG. 2 can correspond to the second III-nitride contact layer and second metal contact in FIGS. 3A-3C and the second III-nitride contact layer and second metal contact of the method illustrated in FIG. 2 can correspond to the first III-nitride contact layer and first metal contact in FIGS. 3A-3C. Although FIGS. 3A-3C are illustrated with the semiconductor device having a substrate 305, the substrate can be omitted so that the first III-nitride contact layer 310 serves as a substrate for the semiconductor device.

It should be recognized that FIGS. 3A-3C illustrate generic III-nitride semiconductor devices and that the semiconductor devices can include additional layers depending upon the type of device, such as light emitting diode, laser, photodetector, and high electron mobility transistor. For example, the semiconductor device can include a cap layer arranged on the second III-nitride contact layer 320 to reduce contact resistance. When the III-nitride semiconductor 300A, 300B, 300C is a light emitting diode, an electron blocking layer can be arranged on the top of the III-nitride semiconductor layer 315 (or 315A and 315B) and the second III-nitride contact layer 320 can be arranged on the electron blocking layer.

It should be noted that one or more layers can optionally be arranged between the substrate 305 and contact layer 310, such as, for example, cladding and superlattice layers. Thus, the phrase "arranged on" should be understood as a direct physical contact between layers and the phrase "arranged adjacent to" should be understood as either a direct physical contact between layers or that there may be one or more layers interposed between to the two layers.

Although FIGS. 3A-3C illustrate semiconductors having a lateral mesa-type design, these semiconductor devices can also be implemented as vertical devices having contacts formed on the two opposite vertical sides of the device.

The adjustment of the work function of a III-nitride contact layer can be appreciated by comparing the valence and conduction band offsets illustrated in FIG. 4. As illustrated, adding boron to an aluminum nitride contact layer to form a boron aluminum nitride contact layer raises the valence band maximum closer to vacuum level compared to an aluminum nitride contact layer. This can reduce the work function, and thus is particularly useful for p-type III-nitride contact layers.

FIG. 5 is a flowchart of a method of forming a III-nitride semiconductor device according to embodiments. Initially, a first III-nitride contact layer is formed (step 505). Next, a second III-nitride contact layer is formed adjacent to the first III-nitride contact layer (step 510). A first metal contact is formed on the first III-nitride contact layer (step 515) and a second metal contact is formed on the second III-nitride contact layer (step 520). The first and second III-nitride contact layers are different boron nitride alloys.

Although exemplary embodiments have been described in connection with III-nitride semiconductor devices, the disclosed boron nitride alloy contact layers can be used in other types of semiconductor devices to adjust the work function of the contact layer relative to the work function of the metal contact. Further, although embodiments have been described in connection with the III-nitride semiconductor device being a light emitting diode or a high electron mobility transistor, the III-nitride semiconductor device can alternatively be another type of optoelectronic device, including a laser diode or photodetector.

The disclosed embodiments provide a semiconductor and method of production. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for making a III-nitride semiconductor device, the method comprising:
   determining work functions of (1) a first III-nitride contact layer having an initial composition and (2) a metal, wherein the determined work function of the first III-nitride contact layer is based on the initial composition of the first III-nitride contact layer;
   determining, based on the determined work functions of the first III-nitride contact layer having the initial composition and of the metal, that a Schottky contact is formed between the first III-nitride contact layer having the initial composition and the metal;
   determining an adjusted composition for the first III-nitride contact layer so that a contact barrier between (1) a first III-nitride contact layer having the adjusted composition and (2) the metal is reduced relative to a contact barrier between (3) the first III-nitride contact layer having the initial composition and (4) the metal, wherein the adjusted composition includes an amount of boron that increases the work function of the first III-nitride contact layer having the initial composition when the first III-nitride contact layer is n-type doped, and decreases the work function of the first III-nitride contact layer having the initial composition when the first III-nitride contact layer is p-type doped; and
   making the III-nitride semiconductor device comprising the first III-nitride contact layer having the adjusted composition, adjacent to a second III-nitride contact layer, a first metal contact, comprising the metal, arranged on the first III-nitride contact layer having the adjusted composition, and a second metal contact arranged on the second III-nitride contact layer,
   wherein the made III-nitride semiconductor device includes at least 0.1% boron in the first III-nitride contact layer having the adjusted composition,
   wherein the made III-nitride semiconductor device includes at least 0.1% of a group III element in the first III-nitride contact layer having the adjusted composition, and
   wherein the group III element is one of Al, Ga, and In.

2. The method of claim 1, further comprising:
   determining a work function of the second III-nitride contact layer having an initial composition and a work function of the second metal contact;
   determining, based on the determined work functions of the second III-nitride contact layer having the initial composition and of the second metal contact, that a Schottky contact would be formed between the second III-nitride contact layer and the second metal contact; and
   determining an adjusted composition for the second III-nitride contact layer, wherein the adjusted composition includes an amount of boron that adjusts the work function of the second III-nitride contact layer having the initial composition.

3. The method of claim 2, wherein the second III-nitride contact layer having the initial composition comprises one or more of gallium, indium, or aluminum.

4. The method of claim 1, wherein the first III-nitride contact layer having the initial composition comprises one or more of gallium, indium, or aluminum.

5. The method of claim 1, wherein the formation of the III-nitride semiconductor device further comprises:
   forming a semiconductor layer between the first III-nitride contact layer having the adjusted composition and the second III-nitride contact layer.

6. The method of claim 1, wherein the formation of the III-nitride semiconductor device further comprises:
   forming a heterojunction of two semiconductor layers between the first III-nitride contact layer having the adjusted composition and the second III-nitride contact layer.

7. The method of claim 1, wherein
   an ohmic contact is formed between the formed first III-nitride contact layer having the adjusted composition and the formed first metal contact.

8. The method of claim 2, wherein
   an ohmic contact is formed between the formed second III-nitride contact layer having the adjusted composition and the formed second metal contact.

9. The method of claim 1, wherein the semiconductor device is a p-n diode, the first III-nitride contact layer having the adjusted composition comprises boron aluminum nitride, and the second III-nitride contact layer comprises aluminum gallium nitride.

10. The method of claim 9, wherein the first III-nitride contact layer having the adjusted composition comprises $B_{0.14}Al_{0.86}N$.

* * * * *